(12) United States Patent
Leenen

(10) Patent No.: US 6,847,318 B2
(45) Date of Patent: Jan. 25, 2005

(54) METHOD AND CIRCUIT FOR REGULATING THE SIGNAL LEVEL FED TO AN ANALOG-DIGITAL CONVERTER

(75) Inventor: Joseph Renier Gerardus Maria Leenen, Veldhoven (NL)

(73) Assignee: GN Resound AS (DK)

( * ) Notice: Subject to any disclaimer, the term of this patent is extended or adjusted under 35 U.S.C. 154(b) by 0 days.

(21) Appl. No.: 10/372,465

(22) Filed: Feb. 21, 2003

(65) Prior Publication Data

US 2004/0008132 A1 Jan. 15, 2004

(51) Int. Cl.[7] .......................... H03M 1/06; H03M 1/62; H03M 1/84; H03M 1/88; H04R 25/00
(52) U.S. Cl. ...................... 341/118; 341/139; 381/312
(58) Field of Search .............................. 341/156, 158, 341/139, 118, 120; 381/94.2, 312, 318, 320

(56) References Cited

U.S. PATENT DOCUMENTS

| | | | | |
|---|---|---|---|---|
| 4,771,472 A | * | 9/1988 | Williams et al. | 381/94.2 |
| 5,471,210 A | * | 11/1995 | Wingender et al. | 341/156 |
| 5,553,151 A | * | 9/1996 | Goldberg | 381/312 |
| 5,610,988 A | * | 3/1997 | Miyahara | 381/312 |
| 6,259,391 B1 | * | 7/2001 | Pakravan et al. | 341/139 |
| 6,359,992 B1 | * | 3/2002 | Preves et al. | 381/312 |
| 6,628,224 B1 | * | 9/2003 | Mulder et al. | 341/156 |
| 6,664,910 B1 | * | 12/2003 | Mulder et al. | 341/158 |

* cited by examiner

Primary Examiner—Patrick Wamsley
(74) Attorney, Agent, or Firm—Michael J. Bolan; Bingham McCutchen LLP

(57) ABSTRACT

Methods and devices for converting an analog input signal into a digital output signal by means of an analog-to-digital converter are provided. The analog input signal is multiplied by a first adjustable scaling factor to form an analog intermediate signal. The analog intermediate signal is converted into a digital representation. The digital representation is multiplied by a second adjustable scaling factor to form a sample signal, and a third adjustable scaling factor to form the digital output signal. The level of the sample signal is determined and compared to first and second threshold values, with the first threshold value being greater than the second threshold value. The first adjustable scaling factor is increased and the second and third adjustable scaling factors are decreased if the sample signal level is higher than the first threshold value. The first adjustable scaling factor is decreased and the second and third adjustable scaling factors are increased if the sample signal level is lower than the second threshold value.

25 Claims, 3 Drawing Sheets

METHOD AND CIRCUIT FOR REGULATING THE SIGNAL LEVEL FED TO AN ANALOG-DIGITAL CONVERTER

BACKGROUND OF THE INVENTION

The invention relates to a method and a device for converting an analog input signal into a digital output signal by means of an analog-to-digital converter.

Analog-to-digital converters are known per se in practice, in a large number of different embodiments thereof.

A fundamental problem of analog-to-digital converters having semiconductor components, including analog-to-digital converters in the form of integrated semiconductor circuits, is the fact that the power consumption increases excessively when the dynamic range increases.

In modern digital hearing aids, for example, the aim is to be able to process input sound levels that are louder than the classical limit of 90–95 dBSPL, for example up to 115 dBSPL, without excessive distortion. It is not possible, however, to use a conventional semiconductor analog-to-digital converter having a dynamic range of for example 100 dB for this purpose, because of the power consumption of such an analog-to-digital converter, which is too high for use in a hearing aid.

On the other hand, it is preferable to have the processing of signals take place digitally as much as possible, in order to prevent the use of analog circuits, which are sensitive to high-frequency radiation, for example from wireless telephones, as much as possible. Furthermore, digital solutions provide greater freedom as regards the programming of parameters for optimizing signal processing.

BRIEF SUMMARY OF THE INVENTION

Consequently, it is a first objective of the invention to provide a method for converting an analog input signal into a digital output signal having an improved dynamic range by means of an analog-to-digital converter.

The invention is based on the insight that in practice it is not necessary, and even undesirable in many cases, for example in the case of a hearing aid, to make the full dynamic input signal range of 100 dB available at the output of the hearing aid, because it exceeds by far the dynamic range of most users whose hearing is impaired.

When using the method according to the invention, first a rough estimate is made of the dynamic range of the digital representation of the analog input signal, which has been attenuated by the first value. If the dynamic range that has been determined in this manner exceeds a predetermined first, or high, threshold value, the analog input signal is attenuated by a second value, and the digital representation of the thus attenuated analog input signal is amplified by a third value. The effect of this is that distortion of the digital output signal caused by overloading of the analog-to-digital converter is effectively prevented by attenuating the analog input signal by the second value, whilst the digital output signal that is presented at the output terminal reaches values above the maximum range of the analog-to-digital converter when the digital representation is simultaneously amplified by the third value. Although the noise in the digital representation is also amplified in comparison with the input signal as a result of the amplification of the digital representation, this will be masked by the higher input signal that will be available in that case.

By subsequently determining whether the signal level of the digital representation of the attenuated analog input signal, which has been amplified by a fourth value, lies below a second, or low, threshold value, which is lower than the first threshold value, it can be determined whether the signal level of the analog input signal has decreased again. If this is indeed the case, the analog input signal will be amplified by a fifth value and the digital representation of the analog input signal thus amplified will be attenuated by a sixth value, in such a manner that the digital output signal delivered at the output terminal will be presented within the maximum range of the analog-to-digital converter again.

The above-described method leads to an increased dynamic signal range, because overloading of the analog-to-digital converter in the case of a strong analog input signal is avoided, whilst the value of the digital output signal being delivered can rise above the maximum range of the analog-to-digital converter, and that, in the case of a weaker analog input signal, the value of the digital output signal being delivered will remain within the maximum range of the analog-to-digital converter.

In a preferred embodiment of the invention, the first, the second and the third values are equal to each other in an absolute sense, not equaling one, and the fourth, the fifth and the sixth values are equal to each other in an absolute sense, essentially equaling one.

In a practical embodiment of the method according to the invention, intended for use in a hearing aid, the first, the second and the third values are in the order of 18 dB, and the fourth, the fifth and the sixth values are in the order of 0 dB.

The invention furthermore relates to a device for converting an analog input signal into a digital output signal, comprising a cascade circuit having an input terminal for presenting the analog input signal, an analog-to-digital converter for converting the analog input signal into a digital representation, a digital amplification circuit and an output terminal for delivering the digital output signal, characterized by a digital circuit for determining the signal level of the digital representation, which is connected to the analog-to-digital converter, a first controllable analog amplification block, which is connected between the input terminal and the analog-to-digital converter, a second controllable digital amplification block, which is connected between the analog-to-digital converter and the circuit for determining the signal level, and a third digital controllable amplification block, which is connected to the digital amplification circuit, wherein the first, the second and the third amplification blocks are connected with their respective control inputs to a logic control circuit for controlling the first, the second and the third amplification blocks, in accordance with the method as discussed above, in response to an output signal produced by the circuit for determining the signal level.

In this embodiment of the device according to the invention, the processing of signals takes place digitally as much as possible, as intended, with the exception of the first amplification block.

A preferred embodiment of the device according to the invention is characterized in that the first amplification block is arranged for amplifying the analog input signal by a fifth value in a first state thereof and attenuating the analog input signal by a second value in a second state thereof, in that the second amplification block is arranged for attenuating the digital representation by a first value in a first state thereof and amplifying the digital representation by a fourth value in a second state thereof, in that the third amplification block is arranged for attenuating the digital representation by a sixth value in a first state thereof and amplifying the digital representation by a third value in a second state thereof, wherein the first, the second and the third values are equal to each other in an absolute sense and the fourth, the fifth and the sixth values are equal to each other in an absolute sense, and in that the amplification blocks are switched simultaneously to the first state or switched simultaneously to the second state.

Consequently, the amplification blocks are switched to a first or to a second state in dependence on the determined dynamic range or signal level.

In a practical embodiment, the first, the second and the third values do not equal one in an absolute sense, for example being in the order of 18 dB, and the fourth, the fifth and the sixth values essentially equal one, that is, being 0 dB.

In a simple embodiment of the device according to the invention, the second and the third digital, controllable amplification blocks may be in the form of bit shifters.

In a more advanced embodiment of the device according to the invention, the circuit for determining the signal level having a first stage, which comprises a circuit for forming the absolute value of the digital representation, a second stage, which comprises a controllable equalizing circuit, and a third stage, which comprises a circuit for automatically controlling the gain of the digital amplification circuit.

This embodiment of the device according to the invention not only provides the advantage of the enhanced dynamic input range, but in addition it prevents prolonged overload of the device via the circuit for automatically controlling the amplification.

Although the configuration comprising the first and the second amplification block ensures that the digital signal that is presented to the circuit for determining the signal level is not affected by the changeover of amplification values, that is, that no signal jumps will occur an the input of the circuit in question, it is preferable in yet another embodiment of the device according to the invention to connect a digital level limiter as well as a digital circuit for removing clicks and signal peaks, which is controlled by the logic control circuit, between the digital amplification circuit and the output terminal.

The invention furthermore relates to a hearing aid, comprising at least one first converter for converting sound into an analog electrical input signal and at least one second converter for converting an electrical signal into sound, as well as signal processing circuits, characterized in that the first converter is operatively connected to the input terminal and in that the second converter is operatively connected, via the signal processing circuits, to the output terminal of the device according to the invention as discussed above.

The invention will be explained in more detail hereinafter by means of an exemplary embodiment, in particular for use in a hearing aid.

DETAILED DESCRIPTION OF THE INVENTION

Figure 1:
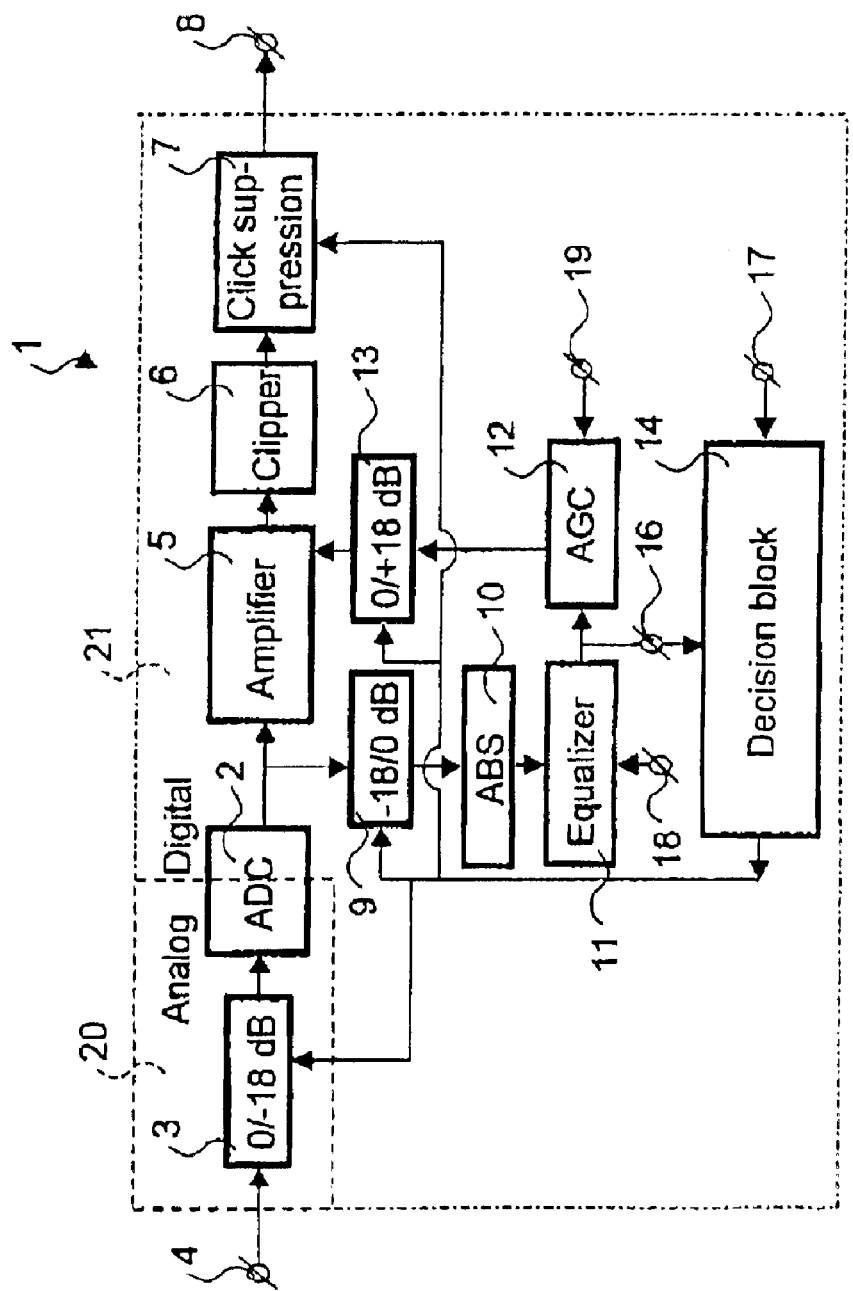
FIG. 1 is a block diagram of a preferred embodiment of the device according to the invention.

FIG. 1 shows a preferred embodiment of a device 1 for converting an analog input signal into a digital output signal according to the present invention.

Reference numeral 2 indicates an analog-to-digital converter, generally indicated with the acronym ADC (Analog Digital Converter) in English professional literature, ADC 2 may be of a type which is known per se, for example an ADC in the form of an integrated semiconductor circuit.

Connected to the analog side or input side of the ADC 2 is a first analog amplification block 3, which is provided with an input terminal 4.

Connected to the digital side or output side of the ADC 2 is a cascade circuit comprised of a digital amplification circuit 5, for example in the form of a digital multiplier, a digital limiting circuit 6 (called "clipper" in English professional literature), and a circuit 7 for removing or suppressing clicks and signal peaks in the digital representation as produced by the ADC 2 of an analog input signal which is presented at the input terminal 4. Connected to circuit 7 is an output terminal 8, on which the digital output signal that is eventually produced is delivered.

Furthermore connected to the output side of the ADC 2 is a cascade circuit consisting of a second digital amplification block 9, a circuit 10 for forming the absolute value of the digital signal delivered by the second amplification block 9, a controllable equalization circuit 11 (called "smoother" in English professional literature) and a circuit 12 for automatically controlling the digital amplification circuit 5, generally indicated by the Acronym AGC (Automatic Gain Control) in English professional literature. Connected to AGC 12 is a third controllable digital amplification block 13, which is in turn connected to the digital amplification circuit 5 for controlling the gain thereof.

The first analog amplification block 3, the second digital amplification block 9, the third digital amplification block 13 and the circuit 7 for removing clicks and signal peaks are controlled by a logic decision block 14, for example comprising a microprocessor or the like, which has a control input 16 that is connected to smoother 11. Logic decision circuit 14 furthermore comprises a setting input 17 for setting a first or high threshold value. The second threshold value is lower than the first threshold value.

In the illustrated preferred embodiment of the device according to the invention, equalization circuit 11 comprises a control input 18 for adjusting the circuit by means of one or more parameters, and AGC 12 comprises a control input 19 for adjusting the AGC 12 by means of one or more parameters.

Device 1 can be incorporated as a whole in an integrated circuit, or be designed as a two-part circuit comprising an analog part 20 and a digital part 21.

As already indicated above, FIG. 1 shows a preferred embodiment of the device according to the invention. In a simpler embodiment, it can be decided, for example, to refrain from using the AGC 12 and, for example, from the circuit 7 for removing or suppressing clicks and signal peaks. Furthermore, circuits 10 and 12 can be substituted for a single circuit for determining the signal level of the digital representation of the analog input signal presented at input terminal 4, which is delivered by the ADC 2 on the digital output side thereof. To those skilled in the art, such circuits are known per se, so that a more detailed explanation thereof is not considered necessary for a good understanding of the invention.

The operation of device 1 will now be explained with reference to the flow chart of FIG. 2, which shows the method by which the decision block 14 controls the first, the second and the third amplification blocks 3, 9, 13.

For the sake of simplicity, it is assumed that the amplification blocks 3, 9, 13 each have a first and a second state, wherein the decision block 14 switches the amplification blocks in question simultaneously to the first state or simultaneously to the second state.

The second amplification block 9 is arranged for attenuating the digital representation of the analog input signal that is produced by the ADC 2 by a first value in its first state and for amplifying the digital representation in question by a fourth value in a second state. The first amplification block 3 is arranged for amplifying the analog input signal presented to the input terminal 4 by a fifth value in a first state thereof and for attenuating the analog input signal by a second value in a second state thereof. The third amplification block 13 is arranged for attenuating the digital representation of the input signal that is produced by the ADC 2 by a sixth value in a first state and for amplifying the digital representation in question by a third value in its second state.

In an application of the device 1 according to the invention in a hearing aid, the first, the second and the third values have been selected to be substantially the same, being set at an absolute value of 18 dB. The fourth, the fifth and the sixth values have likewise been selected to be substantially the same, being set at a value of 0 dB, which corresponds to amplification or attenuation by the unit factor.

Figure 2:
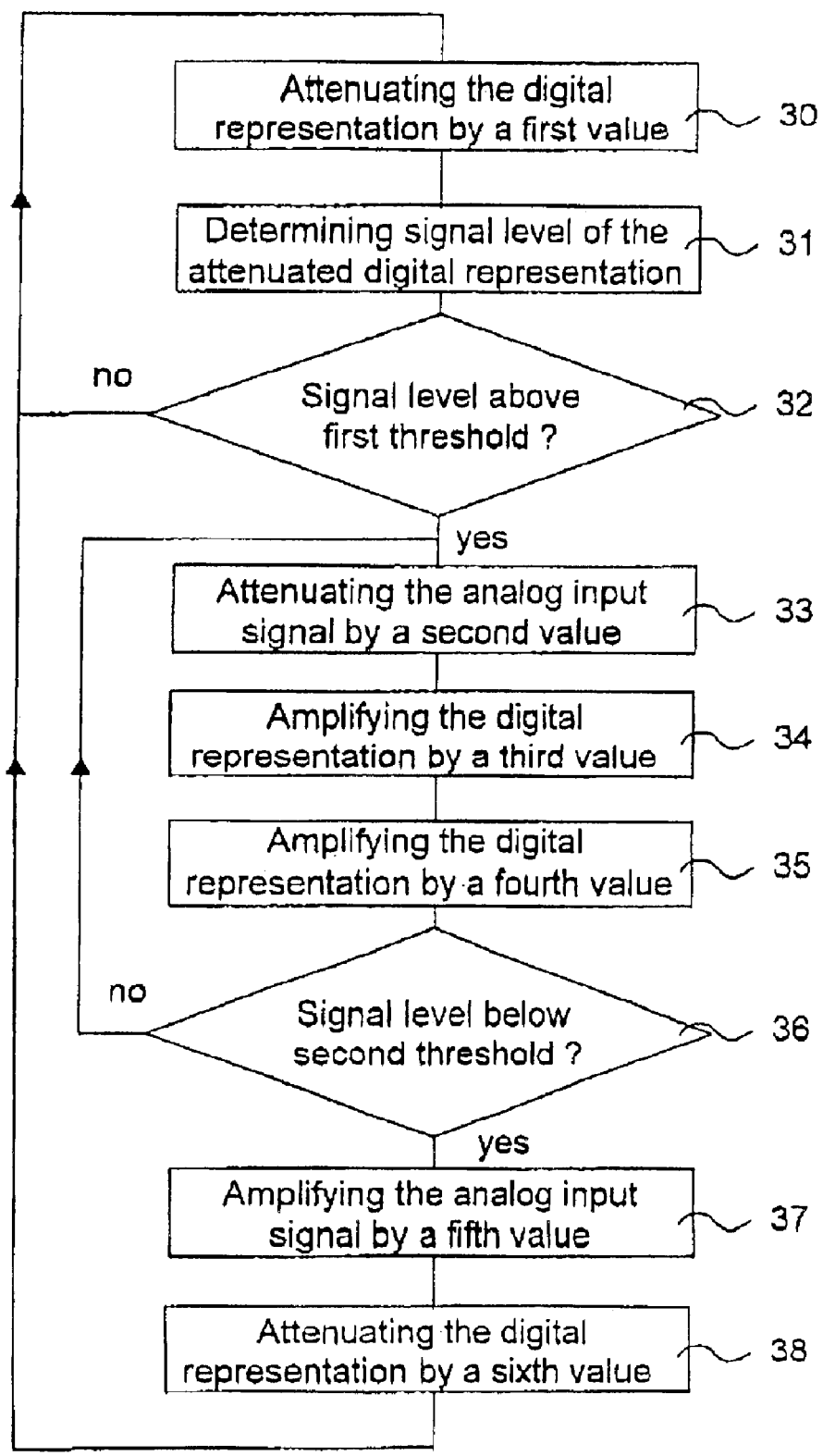
FIG. 2 is a flow diagram of the main steps of the method according to the invention.

Let us now consider FIG. 2. Proceeding from the above-described settings in the first state of the amplification blocks, the ADC 2 produces a digital representation of the analog input signal as presented to the input terminal 4. The digital representation in question is presented to the output terminal 8 via the amplification circuit 5 and the clipper 6 and also the circuit 7 for removing peaks and clicks, and that in unattenuated form, since the third amplification block 13 is set at 0 dB in its first state. After 18 dB attenuation of the digital representation ADC 2 by the second amplification block 9 (step 30), the signal level is determined by means of circuits 10 and 12 (see step 31). The signal level thus determined is presented to the control input 16 of the decision circuit 14.

If the level of the digital representation thus attenuated is higher than the first, or high, threshold value (step 32), it can be concluded that the analog input signal 4 has or will have a value so high that overdriving of the device 1 occurs or threatens to occur.

In order to prevent overloading, the decision circuit 14 switches the amplification blocks 3, 9 and 13 to their second state, in which the analog input signal is attenuated by a factor of 18 dB, whilst the digital representation from the ADC 2 is amplified by an identical value via the amplification circuit 5, by means of the third amplification block 13, so that the digital output signal that is presented to the output terminal 8 has been amplified by a factor of 18 dB in comparison with the digital representation, steps 33 and 34. Although the input signal range has been attenuated by a value of 18 dB by the amplification block 3, the amplification of the digital representation makes it possible for the level of the output signal on the output terminal 8 to reach values above the maximum range of the ADC 2. The result of this is that the signal range of the device 1 has been effectively extended, without distortion, in comparison with a similar circuit without amplification blocks 3, 9 and 13.

In its second state, the second amplification block 9 provides the digital representation of the analog input signal 4 at the level determination circuits 10, 12 in unattenuated form (step 35). If the level of the digital representation is lower than a second, or lower, threshold value, step 36, it can be concluded that the level of the analog input signal 4 has decreased sufficiently for being processed without distortion by device 1. Consequently, the amplification blocks 3, 9 and 13 are switched back to their first state again via decision circuit 14 (steps 37, 38, 30), so that the digital representation of the analog input signal 4 will be provided in unattenuated form as a digital output signal at the output terminal 8, so that the full input signal range of the analog input signal is followed.

If it is subsequently established again that the signal level of the digital representation 2 rises above the first threshold value, the amplification blocks 3, 9 and 13 will be switched to their second state again, etc. If the first threshold value has not been exceeded in step 32, the amplification blocks 3, 9, 13 will not be switched to a different state. Similarly it applies that if the signal level has not fallen below the second threshold value in step 36, switching of the amplification blocks 3, 9, 13 will not take place, either.

Those skilled in the art will appreciate that in an even more advanced embodiment of the circuit according to the invention, the amplification blocks may comprise more than two states, wherein the respective first, second, third, fourth, fifth and sixth values to which the amplification blocks 3, 9 and 13 can be switched can assume different magnitudes, depending on the state of the amplification blocks 3, 9 and 13 at that point.

Since the amplification blocks are switched simultaneously in the device 1 according to the invention, the determination of the signal level is not influenced by switching Jumps on the inputs of circuits 10, 11. On the other hand, ADC 2 can be expected to produce clicks upon switching of amplification block 3. These clicks can be removed in an effective manner, however, by suitably controlling circuit 7 via decision block 14.

In a simple embodiment of the device according to the invention, simple bit shifters can be used as the digital amplification blocks 9 and 13.

The correct setting of the first and the second threshold value on adjustment input 17 of decision block 14 depends on the use of the device 1. If the device is used in a hearing aid, it is not necessary, for example, to switch the amplification blocks 3, 9, 13 when overdriving lasts only briefly. A sampling frequency of approx. 16 kHz for sampling or determining the signal level of the digital representation of the ADC 2 will usually suffice in that case. This will also influence the power consumption of the device 1, which in itself is important again upon use thereof in battery-fed applications, such as a hearing aid.

In conclusion it can be noted that the device according to the invention is in particular suitable for effectively preventing overdriving or overloading for prolonged periods of time, without reducing the dynamic signal range and without there being a need to use analog-to-digital converters having a high dynamic range and the high power consumption that is associated therewith.

Figure 3:
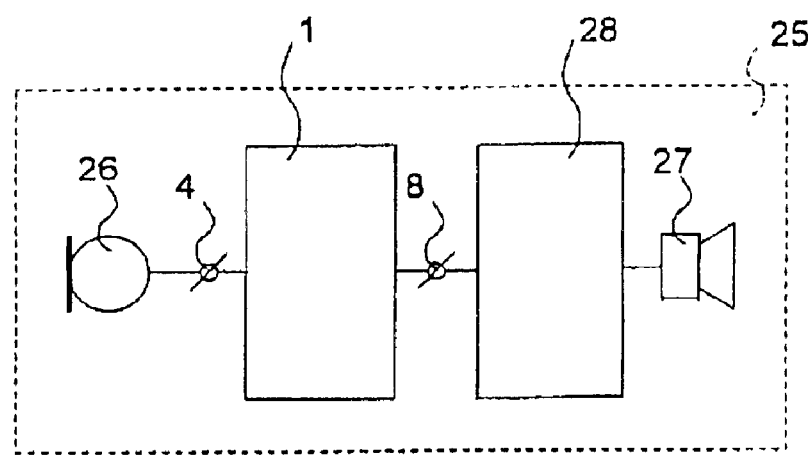
FIG. 3 is a block diagram of a hearing aid fitted with a device according to the invention.

FIG. 3 shows a simple block diagram of a hearing aid 25, comprising a first converter in the form of a microphone 26 for converting sound into an analog electrical signal, a second converter in the form of a loudspeaker 27 for converting an electrical signal into sound, and a processing device, comprising at least one device 1 as discussed above, wherein the microphone 26 is connected to the input terminal 4 and the loudspeaker 27 is connected to the output terminal 8 of the device 1 via interposed filters and other signal processing circuits that are known per se to those skilled in the art.

What is claimed is:

1. A method for converting an analog input signal into a digital output signal by means of an analog-to-digital converter, comprising:
   converting said analog input signal into a digital representation;
   multiplying said digital representation by a scaling factor to form a sample signal;
   determining the level of said sample signal;
   comparing said sample signal level with first and second threshold values, said first threshold value being greater than said second threshold value,
   and if said sample signal level is higher than said first threshold value:
      attenuating said analog input signal by a second value,
      amplifying said digital representation by a third value to form said digital output signal, and
      setting said scaling factor to a fourth value;
   and if said sample signal level is lower than said second threshold value:
      amplifying said analog input signal by a fifth value,
      attenuating said digital representation by a sixth value to form said digital output signal; and
      setting the scaling factor to a first value lesser than said fourth value.

2. A method according to claim 1, characterized in that said first, said second and said third values are equal to each other in an absolute sense, and said fourth, said fifth and said sixth values are equal to each other in an absolute sense.

3. A method according to claim 2, characterized in that said first, said second and said third values do not equal one in an absolute sense, and said fourth, said fifth and said sixth values essentially equaling one.

4. A device for converting an analog input signal into a digital output signal, comprising a cascade circuit having an input terminal for presenting said analog input signal, an analog-to-digital converter for converting said analog input signal into a digital representation, a digital amplification circuits and an output terminal for delivering said digital output signal, characterized by a digital circuit for determining the signal level of said digital representation, which is connected to said analog-to-digital converter, a first controllable analog amplification block, which is connected between said input terminal and said analog-to-digital converter, a second controllable digital amplification block, which is connected between said analog-to-digital converter and said circuit for determining the signal level, and a third digital controllable amplification block, which is connected to said digital amplification circuit, wherein said first, said second and said third amplification blocks are connected with their respective control inputs to a logic control circuit for controlling said first, said second and said third amplification blocks, in accordance with the method of claim 1, in response to an output signal produced by said circuit for determining the signal level.

5. A device according to claim 4, characterized in that said first amplification block is arranged for amplifying said analog input signal by a fifth value in a first state thereof and attenuating said analog input signal by a second value in a second state thereof, in that said second amplification block is arranged for attenuating said digital representation by a first value in a first state thereof and amplifying said digital representation by a fourth value in a second state thereof, in that said third amplification block is arranged for attenuating said digital representation by a sixth value in a first state thereof and amplifying said digital representation by a third value in a second state thereof, wherein said first, said second and said third values are equal to each other in an absolute sense and said fourth, said fifth and said sixth values are equal to each other in an absolute sense, and in that said amplification blocks are switched simultaneously to said first state or switched simultaneously to said second state.

6. A device according to claim 5, characterized in that said amplification blocks are arranged such that said first, said second and said third values do not equal one in an absolute sense in said first state thereof, and in that said fourth, said fifth and said sixth values essentially equal one in said second state thereof.

7. A device according to claim 6, characterized in that said second and said third amplification blocks are arranged as bit shifters.

8. A device according to claim 4, characterized in that said circuit for determining the signal level having a first stage, which comprises a circuit for forming the absolute value of said digital representation, a second stage, which comprises a controllable equalizing circuit, and a third stage, which comprises a circuit for automatically controlling the gain of said digital amplification circuit.

9. A device according to claim 4, characterized in that a digital level limiter as well as a digital circuit for removing clicks and signal peaks, which is controlled by said logic control circuit, are connected between said digital amplification circuit and said output terminal in said cascade circuit.

10. A hearing aid, comprising at least one first converter for converting sound into an analog electrical input signal and at least one second converter for converting an electrical signal into sound, as well as signal processing circuits, characterized in that said first converter is operatively connected to the input terminal and in that said second converter is operatively connected, via said signal processing circuits, to the output terminal of the device according to claim 4.

11. A method for converting an analog input signal into a digital output signal by means of an analog-to-digital converter, comprising:
   multiplying said analog input signal by a first adjustable scaling factor to form an analog intermediate signal;
   converting said analog intermediate signal into a digital representation;
   multiplying said digital representation by a second adjustable scaling factor to form a sample signal;
   multiplying said digital representation by a third adjustable scaling factor to form said digital output signal;
   determining the level of said sample signal;
   comparing said sample signal level with first and second threshold values, said first threshold value being greater than said second threshold value;
   increasing said first adjustable scaling factor and decreasing said second and third adjustable scaling factors if said sample signal level is higher than said first threshold value; and
   decreasing said first adjustable scaling factor and increasing said second and third adjustable scaling factors if said sample signal level is lower than said second threshold value.

12. A method according to claim 11, wherein said first adjustable scaling factor multiplied by said second adjustable scaling factor equals a constant, and said first adjustable scaling factor multiplied by said third adjustable scaling factor equals a constant.

13. A method according to claim 11, wherein said decreased first and second adjustable scaling factors and said increased third adjustable scaling factor do not equal one in an absolute sense, and said increased first and second adjustable scaling factors and said decreased third adjustable scaling factor essentially equals one.

14. A method according to claim 11, wherein said first, second, and third adjustable scaling factors are simultaneously adjusted.

15. A method according to claim 11, wherein each of said first, second, and third adjustable scaling factors can be adjusted only between an upper value and a lower value.

16. A method according to claim 11, further comprising:
converting sound into said analog electrical input signal; and
converting said digital output signal into sound.

17. A device for converting an analog input signal into a digital output signal, comprising:
an input terminal for presenting said analog input signal;
an analog-to-digital converter for converting said analog input signal into a digital representation;
a digital amplification circuit;
an output terminal for delivering said digital output signal;
a digital detection circuit for determining the signal level of said digital representation;
a first controllable analog amplification block connected between said input terminal and said analog-to-digital converter, said first amplification block having a first adjustable value;
a second controllable digital amplification block connected between said analog-to-digital converter and said digital detection circuit, said second amplification block having a second adjustable value;
a third digital controllable amplification block connected to said digital amplification circuit, said third amplification block having a third adjustable value;
a logic control circuit configured for:
comparing said determined signal level with first and second threshold values, said first threshold value being greater than said second threshold value,
increasing said first adjustable and decreasing said second and third adjustable values if said sample signal level is higher than said first threshold value, and
decreasing said first adjustable value and increasing said second and third adjustable values if said sample signal level is lower than said second threshold value.

18. A device according to claim 17, wherein said amplification blocks are arranged such that said first adjustable value multiplied by said second adjustable value equals a constant, and said first adjustable value multiplied by said third adjustable value equals a constant.

19. A device according to claim 17, wherein said amplification blocks are arranged such said decreased first and second adjustable values and said increased third adjustable value do not equal one in an absolute sense, and said increased first and second adjustable values and said decreased third adjustable value essentially equals one.

20. A device according to claim 17, wherein each of said amplification blocks are arranged such that each of the first, second, and third adjustable scaling values can be adjusted only between an upper value and a lower value.

21. A method according to claim 17, wherein said logical control circuit is configured for simultaneously adjusting said first, second, and third adjustable values.

22. A device according to claim 17, wherein said second and said third amplification blocks are arranged as bit shifters.

23. A device according to claim 17, wherein said signal detection circuit comprises a first stage, which comprises a circuit for forming the absolute value of said digital representation, a second stage, which comprises a controllable equalizing circuit, and a third stage, which comprises a circuit for automatically controlling the gain of said digital amplification circuit.

24. A device according to claim 17, further comprising a digital level limiter and a digital click and signal peak suppression circuit connected between said digital amplification circuit and said output terminal.

25. A hearing aid, comprising:
a first converter for converting sound into an analog electrical input signal;
signal processing circuitry;
a second converter for converting an electrical signal into sound; and
said device of claim 17, wherein said first converter is coupled to said input terminal, and said second converter is coupled to said output terminal through said signal processing circuitry.

* * * * *